(12) United States Patent
Tang et al.

(10) Patent No.: US 10,222,409 B2
(45) Date of Patent: Mar. 5, 2019

(54) METHOD AND SYSTEM FOR DETECTING AND LOCATING SINGLE-PHASE GROUND FAULT ON LOW CURRENT GROUNDED POWER-DISTRIBUTION NETWORK

(71) Applicant: BEIJING INHAND NETWORKS TECHNOLOGY CO., LTD.

(72) Inventors: Xianwu Tang, Beijing (CN); Jianliang Zhang, Beijing (CN); Jinao Li, Beijing (CN); Hongwei Zang, Beijing (CN)

(73) Assignee: BEIJING INHAND NETWORKS TECHNOLOGY CO., LTD., Beijing (CN)

( * ) Notice: Subject to any disclaimer, the term of this patent is extended or adjusted under 35 U.S.C. 154(b) by 139 days.

(21) Appl. No.: 14/774,123

(22) PCT Filed: Mar. 27, 2014

(86) PCT No.: PCT/CN2014/074206
§ 371 (c)(1),
(2) Date: Sep. 9, 2015

(87) PCT Pub. No.: WO2014/154164
PCT Pub. Date: Oct. 2, 2014

(65) Prior Publication Data
US 2016/0041216 A1 Feb. 11, 2016

(30) Foreign Application Priority Data

Mar. 29, 2013 (CN) .......................... 2013 1 0106380
Apr. 9, 2013 (CN) .......................... 2013 1 0120519

(51) Int. Cl.
*G01R 29/18* (2006.01)
*G01R 31/08* (2006.01)
(Continued)

(52) U.S. Cl.
CPC ........... *G01R 29/18* (2013.01); *G01R 15/142* (2013.01); *G01R 31/025* (2013.01); *G01R 31/08* (2013.01);
(Continued)

(58) Field of Classification Search
CPC ....... G01R 29/18; G01R 31/025; G01R 31/08
(Continued)

(56) References Cited

U.S. PATENT DOCUMENTS

| 5,495,384 A * | 2/1996 | Wallis ..................... G01R 13/06 361/42 |
| 6,718,271 B1 * | 4/2004 | Tobin .................... G01R 31/024 324/521 |

(Continued)

*Primary Examiner* — Jeff W Natalini
(74) *Attorney, Agent, or Firm* — John Ye

(57) ABSTRACT

A method and system for detecting and locating a single-phase ground fault on a low current grounded power-distribution network, comprising: respectively testing and picking up the voltage signals and current signals at multiple positions on each phase feeder (61), and determining the corresponding transient voltage signals and transient current signals according to the extraction of the voltage signals and the current signals (62); when the change in the transient voltage signals and the transient current signals exceeds a preset threshold (63), synchronously picking up the voltage signals and current signals at multiple positions on a three-phase feeder (64); calculating corresponding zero-sequence voltages and zero-sequence currents according to the voltage signals and current signals synchronously picked up at multiple positions on the three-phase feeder (65), and then extracting the steady-state signal and transient signal of the zero-sequence voltage and zero-sequence current at each position on the three-phase feeder (66); and determining a specific fault location on a faulty line according to the steady-state signal and the transient signal (67). The method effectively detects and displays a single-phase ground fault on a low current grounded power-distribution network.

4 Claims, 11 Drawing Sheets

(51) Int. Cl.
*H02H 3/38* (2006.01)
*H02H 7/26* (2006.01)
*G01R 31/02* (2006.01)
*G01R 15/14* (2006.01)

(52) U.S. Cl.
CPC ............ *G01R 31/086* (2013.01); *H02H 3/38* (2013.01); *H02H 7/26* (2013.01); *Y04S 10/522* (2013.01)

(58) Field of Classification Search
USPC ........................................ 324/509, 512–536
See application file for complete search history.

(56) References Cited

U.S. PATENT DOCUMENTS

| | | | | |
|---|---|---|---|---|
| 7,180,300 B2* | 2/2007 | Premerlani | .......... | G01R 31/086 |
| | | | | 324/509 |
| 7,728,600 B2* | 6/2010 | Wahlroos | ............. | G01R 31/086 |
| | | | | 324/500 |
| 8,000,913 B2* | 8/2011 | Kreiss | .................... | G06Q 50/06 |
| | | | | 324/512 |
| 8,525,522 B2* | 9/2013 | Gong | .................... | G01R 31/086 |
| | | | | 324/519 |
| 2011/0109465 A1* | 5/2011 | Jurisch | ................ | G01R 31/088 |
| | | | | 340/635 |
| 2013/0096854 A1* | 4/2013 | Schweitzer, III | .... | G01R 31/085 |
| | | | | 702/59 |

\* cited by examiner

METHOD AND SYSTEM FOR DETECTING AND LOCATING SINGLE-PHASE GROUND FAULT ON LOW CURRENT GROUNDED POWER-DISTRIBUTION NETWORK

CROSS REFERENCES TO RELATED APPLICATIONS

This application is a continuation of International Application No. PCT/CN2014/074206, filed in the Chinese Patent Office on Mar. 27, 2014, which is a continuation of Chinese Application No. 201310106380.2, filed on Mar. 29, 2013, and 201310120519.9, filed on Apr. 9, 2013, the entire contents of which are incorporated herein by reference.

BACKGROUND OF THE INVENTION

The present invention relates to the field of electronic technology, particularly to a low current single-phase ground fault detection and location methods and systems.

Power system contains power supply from power plants. Power is transferred to the load side first by high or extra high voltage transmission network, and then by the lower voltage levels of distribution network.

A common fault in the main power grid is short circuit and ground fault. Short circuit faults include three-phase and two-phase short circuit faults. A common ground fault type is a single-phase ground. Short circuit fault detection technology has been very mature. But for single-phase ground fault detection, especially for low current grounded distribution network single-phase ground, there is no effective method, and is recognized as a worldwide problem.

China and some countries are using mostly low current grounded grid distribution network. Therefore, the vast majority of failures are single-phase ground. The main advantage of low current grounded distribution grid is that: in a single-phase ground fault, unlike a short circuit, the system produces only a low ground current, therefore, the three-phase line voltage is still symmetrical, and does not affect the normal operation of the system. China regulations require if a single-phase ground fault occurs, the low current grounded distribution network should continue to operate with fault 1~2 h. Because of this reliability, the low current grounded distribution network has been widely used.

However, single-phase ground fault must be found as quickly as possible during single-phase ground fault troubleshooting. Otherwise, the over voltage caused by the failure of the ground fault can cause the cable to explode, the voltage transformer PT to burn down, the bus to burn and other power system accidents. If not fixed in time, long-running ground fault will burden local residents, livestock with tremendous security risks.

The grounded mode of the low current grounded power distribution network is either not grounded or grounded by the arc suppression coil. According to DL/T 1997-620 "AC electrical equipment over voltage protection and insulation coordination", in the 10 kV distribution network, which is composed of pure overhead line or overhead line and cable, if the capacitor current is less than 10 A, it can be used ungrounded. But when the capacitor current is greater than 10 A, it is necessary to install the arc suppression coil.

Distribution network with either neutral point ungrounded or arc suppression coil grounded mode, when the single-phase ground occurs in, does not produce a large fault current in A, B, C phases, the following details the two cases:

1 Distribution Network with Neutral Point Ungrounded Method

When the distribution network with neutral point N is not grounded, as shown in FIG. 1, in one of the three phases A, B, C, such as A phase, assume a ground fault occurs. In the initial phase failure, phase A voltage will drop rapidly, voltages of non-fault phase B and phase C will rise rapidly, the neutral point voltage also will rise rapidly. While the A-phase feeder ground distributed capacitance will take place quickly discharging to ground, B phase and C phase feeder ground distributed capacitance rapidly charged through the ground to form a short-lived charge-discharge process (10 ms~20 ms), have a relatively large transient capacitive current. Than the system will enter into steady state power by way of the non-fault phase distributed capacitance and ground, resulting in a continuous steady state capacitive current. In this process, the transient capacitive current is much larger than the steady-state capacitive current.

Adding all the three-phase line currents, one can get the line zero-sequence current. Similarly, adding the three-phase line voltages together, one can get the line zero-sequence voltage. In this process, the fault line zero sequence current is shown in FIG. 2. Before a ground fault occurs, the line zero-sequence current is very low, approximately zero. When a ground fault occurs, first there is the capacitor charge and discharge transient process, resulting in a relatively large high frequency transient capacitive current, and then to maintain a major energy concentrated in the frequency (50 Hz or 60 Hz) of the steady state capacitive current.

2 Distribution Network Neutral Point Petersen Coil Grounded Method

When the distribution network with neutral point N grounded through the Petersen coil, shown in FIG. 3, in one of the A, B, C three phases, for example, phase A, assume a ground fault occurs. Similar to the ungrounded method, in the initial part of the failure, phase A voltage will drop rapidly, voltages of non-fault phase B and phase C will rise rapidly. Also will rise is the neutral voltage. Next, the A-phase feeder ground distributed capacitance quickly discharged to ground through grounded points. B phase and C phase feeder ground distributed capacitance rapidly charged through the ground to form a short-lived charge-discharge process (10 ms~20 ms), forming a relatively large transient capacitive current. Next, the suppression coil L will produce a compensating current to compensate for the non-fault phase power through the distributed capacitance, and in the process, forming ground capacitive current comparable to a steady state. Last, the system enters the steady state. Using neutral point arc suppression coil grounded method, the steady capacitance fault line current will become very low, and unlike FIG. 2, no large steady-state zero-sequence current is produced. But in the fault line, the transient capacitive current is not affected.

In low current grounded method, in particular by Petersen coil, in the distribution network single-phase ground fault situation, the instantaneous fault current duration is very short, and the steady-state fault current is very low. Data shows that the vast majority of single-phase ground fault grounded resistance is greater than 800Ω, belongs to the high-impedance ground fault, such as through the branches, the grass, the damp earth walls, etc., such that the instantaneous fault current is not large, with very short duration of 10~20 ms. Thus in a low current grounded method with a single-phase ground fault, the detection and location is recognized as a worldwide problem. There are several methods and apparatus for low current single-phase ground fault detection:

1 Substation Low Current Grounded Line Selection Means

Existing low current grounded line selection device allows the substation bus to identify which line ground fault has occurred. In FIGS. 1 and 3, for example, there are two lines—a fault line and a non-fault line. Through a low current grounded line selection device, one can identify the fault line.

A low current grounded line selection device works by monitoring zero sequence current residual voltage at substation bus and each branch line. By treating a sudden increase in the zero-sequence voltage in the grounded line as a trigger condition, follows by using the various branches of the line the zero-sequence current steady state information and transient information, the device will identify the fault line. According to the use of different information, the device operation can be classified as of steady line mode or transient line mode.

Steady line determination is mainly based on:
(1) The zero sequence current amplitude is maximum at the fault line;
(2) The fault line's zero-sequence current phase is opposite of that of the non-fault line;
(3) The fault line's zero-sequence reactive power is negative;
(4) The fault line's zero-sequence active power is large;
(5) The current of 5th harmonic is large at the fault line and is opposite of that of the non-fault line;
(6) The fault line's negative sequence current is large.

Transient line determination is mainly based on:
(1) The non-fault line and the fault line differs in that when phase voltage reaches zero-sequence, the transient current and voltage of the first half-wave amplitude and phase are different;
(2) The use of other processing methods such as from the zero-sequence current characteristics of transient information, extracting a low wave, and from there, with artificial intelligence, such as neural networks, identifying the fault line and non-fault line.

The main disadvantages of the low current grounded line selection device are:
(1) The existing substation PT (voltage transformer) and CT (current transformer) affect the reliability and accuracy of the selected line.

For the low current grounded line selection device to trigger, the bus zero-sequence voltage signal must be connected in parallel on the bus PT to be obtained. Selection device is subject to PT ferromagnetic resonance, and it will cause significant interference.

Because factors such as the special zero-sequence CT volume, high cost, and the need to install power, for low current grounded line selection device to obtain zero sequence current is not usually obtained through special zero-sequence CT, but by a substation having three-phase or two-phase measurements obtained with CT. The ideal CT, is one with no magnetizing current consumption, the ampere-turns of the primary and the secondary coils are equal in value, the primary current and the secondary current phase measurements are the same and there is no phase shift. In a practical CT, there is an excitation current, thus the ampere-turns of the primary and the secondary coils are not equal, and the primary current phase and the secondary current phase are not the same. Therefore, due to the actual CT usually having angular error and phase change error, resulting in an unbalanced three-phase CT. Also the three-phase CT superposition of zero-sequence current is an unbalanced current, and the actual zero-sequence current errors exist, that would impact of the line election results. In addition, in traditional measurement of CT, due to the magnetic core having non-linear excitation characteristics, there is an impact on the current linearity from low current to large current. When the current is large, the core exhibits magnetic saturation, which will lead to CT saturation. In practice, the mid to low voltage grid frequently exhibits the CT saturation phenomenon, causing failure in getting the correct zero sequence current in performing line selection. Moreover, the core maintains energy storage cycle and magnetizing cycle, which makes CT transient characteristics not satisfactory. When current changes are not properly followed, it is difficult to accurately capture weak transient signals.

(2) The location of the ground fault cannot be accurately located.

Low current grounded line can only be installed in power distribution bus to sub location, and only for selecting a ground fault in the branch line. It is not capable to locate the position of branch line where the ground fault occurs.

2 Signal Injection Method and Apparatus

Signal injection method through the injection signal source with fault detection and location indicator may be used for detecting a large ground current on a permanent ground fault. The principle of this method is: when the substation detects that the zero-sequence voltage increases significantly and continue for some time, together with the zero-sequence current being greater than a threshold value, and continue for some time, it can be determined that the ground fault occurs; upon this determination, Petersen coil is required and inserted; thereafter, by inserting at the neutral point of the transformer with a certain pattern of fault current signal; because the fault current signal can be detected by the fault indicator at a location before the ground fault, but not at a location after the ground fault, the location of the ground fault can be traced.

As seen in FIG. 4, the ground source is connected between the neutral of the grounded substation transformer and ground with controlled resistive loads (mid-range resistance, typically 100Ω). When ground fault is detected, using micro controller, at the neutral of the grounded substation transformer (in the case of non-grounded transformer, the bus neutral point), the resistive load source is automatically deployed for a short period of time, so that between the substation and field ground a special coded low signal current is produced. By resistive load switching with ground source code control, it can generate a superimposed load current embedded with coding in the current signal. By installing the ground fault indicators though out at the line and at the branch point of the substation, the detection of the current signal could be automated, and therefore, the goal of locating the fault is achieved.

Injection signal source method has the following disadvantages:
(1) It requires the installation of the signal source in the substation, therefore, changing the system operation;
(2) The signal sources and other devices require additional investment and construction, and the construction process requires a power outage;
(3) For ground fault at the common resistance of 800Ω or more, this method was unable to produce a sufficient large coded signal current to be detectable by fault indicator, therefore, this method cannot detect high-resistance ground fault;
(4) It cannot detect transient ground faults.

3 Network Feeder Terminal Unit FTU Based Method for Ground Fault Detection and Location FTU network based ground fault detection and location method is shown in FIG. 5. The method works by installing switches and related detection terminal FTU throughout the line and wiring them in a network, so to record three-phase current, voltage waveform data during ground fault and send the data to the automated central system to be analyzed in order to determine within which switch the fault lies.

The main disadvantages of the FTU network based ground fault detection and location method is:

(1) There is a need to install the switches, and the switches must have an internal CT and PT, with switches and FTU being a huge investment;

(2) In measuring CT, it would be difficult to capture the transient signals; also it would be facing high current saturation; and during the three-phase superimposed zero-sequence, phase imbalance is causing large errors; these are factors making high resistance grounded difficult to be detected;

(3) PT has ferromagnetic resonance problem;

(4) Installing switch and FTU needs power lines to be offline;

(5) It can only locate the fault up to between switches, but not more in terms of accurate positioning;

(6) For overhead line to provide power to the FTU is very difficult, negatively affecting its installation and functioning.

At present time, the low current grounded system, especially the neutral point Petersen coil grounded system, the lack of effective ground fault detection methods and equipment makes it hard to detect the ground fault position. Many electricity departments are still using manual diagnostic methods such as cable method to locate the ground faults. These methods are of low degree of automation, are difficult and inefficient to implement, and are unable to meet the requirements of the power system to continue to improve the reliability of power supply. These methods are also making it difficult to improve power quality and power supply reliability. In order to improve the distribution network for low current grounded power supply reliability, it is necessary to provide a method and apparatus, when the single-phase distribution network has aground fault, whether it is based on low resistance or high resistance grounded, or whether it is instantaneous fault or a permanent fault, to effectively detect and locate the fault.

SUMMARY OF THE INVENTION

The purpose of the present invention is to provide a low current single-phase ground fault detection and location, which can determine the location timely and accurately.

The purpose of the present invention is achieved by the following technical solutions embodied in a method, a device and a system:

A low current single-phase ground fault detection and location method, comprising:
  monitoring and extracting on each phase feeder the voltage and current signals in multiple locations, and to determine the corresponding transient voltage signal and transient current signal based on the voltage and current signals;
  When the degree of change in the transient voltage signal and the transient current signal exceeds a set threshold, synchronously extract the three-phase feeder voltage and current signals at a plurality of positions;
  based on the synchronously extracted three-phase voltage and current signals at the plurality of positions, calculate the corresponding zero-sequence voltage and zero-sequence current;
  based on the steady state vs. transient zero-sequence voltage and zero-sequence current values, determine the fault line, and then further determine the specific location of the fault line.

The transient voltage signal and the transient current signal level change data includes: the individually calculated magnitude of each of the transient voltage and current signals, the average, the differential value and the integral value of one or more of the degrees of change.

The steps of synchronously extracting the voltage and current signals at the plurality of positions on the three-phase feeders include: using time division multiplexing wireless communication network timing and GPS timing to synchronize time and then based on the synchronized time to extract voltage and current signals on the three-phase feeders at multiple locations.

The steps to determine the fault line based on the zero-sequence voltage and zero-sequence current in steady state include: extracting the steady state characteristic values at various locations for the zero sequence voltage and zero sequence current, the characteristic values include: one or more of amplitude, average, differential value and integral value; also extracted are steady state zero sequence active power and reactive power sequence; extracting the steady-state waveform of the zero-sequence voltage and zero-sequence current signals at various locations; by comparing after-fault data with the steady state data of each phase line and the waveform similarity and difference to determine the fault line;

The steps to determine the specific location of the fault line based on the zero-sequence voltage and zero-sequence current transient signals include: extracting the transient zero-sequence voltage signal and zero sequence current for each position of the line before the determined fault; extracting a set of characteristic values of the transient signals, the characteristic values include: one or more of amplitude, average, differential value and integral values, as well as at the various locations the transient zero sequence active power and reactive power, also calculated are transient zero-sequence voltage and zero-sequence current signal waveform similarity at various locations; and based on comparing the fault line signal waveform similarity and the characteristic values, by comparing the differences of the two at the different locations, to derive at the ground fault location of failure on the line.

The method further comprises: in determining the ground fault location, the geographic information system (GIS) map is used to show the ground fault point, and to display the ground fault information by sending over a wireless communication network the fault indication unit at the ground fault point.

A feeder monitoring device, comprising:
feeder parameter monitoring module for picking up the detected voltage and current signals in each phase feeder at multiple locations, and based on the voltage and current signals to determine the corresponding transient voltage and transient current signals; when the degree of change of the transient voltage signal and the transient current signal exceeds a set threshold, send a notification to other adjacent phase feeder monitoring devices to synchronize signal pickup in the other monitoring modules;
signal synchronization pickup module for receiving the notice sent by the adjacent feeder monitoring device's feeder parameters monitoring module, performing synchronization and picking up the voltage and current signals synchronously with the other device's signal synchronization pickup module, and reporting to the sending device.

The said signal synchronization module would include a synchronization processing module. The synchronization processing module is synchronized by time division multiplexing using the wireless communication network's timing coupled with the GPS timing, thereby enabling the said signal synchronization pickup module to be based on time synchronization regarding the voltage and current signals pickup at each phase on the feeder.

The apparatus further comprises: fault indication module, for after determining a ground fault to indicate the location of the point of failure, particularly implemented with wide angle bright LED lights, and through a combination of different numbers of diodes, as well as though flashing intervals and frequency to indicate the different types of failure.

The said feeder parameter monitoring module uses capacitive voltage sensors to pick up the voltage signal, and uses electronic current sensors to pick up the current signal. The electronic current sensor includes: current transformers, wound or printed circuit Rogowski coil. And when the feeder parameter monitoring module detects that the transient voltage signal and the transient current signal exceed a set threshold, notify through infrared, sound, ultrasound or magnetic signal as a trigger to signal to the adjacent feeder monitoring device, with its signal synchronization pickup module. The notification method comprising:

directly transmitting notification to the adjacent feeder monitoring devices on the other two phases, for their signal synchronization pickup module;

or, transmit notification to a second adjacent monitoring device in a second phase and then let the second monitoring device to transmit to a third adjacent monitoring device on a third phase, for their signal synchronization module;

or, transmit notification to a communication terminal device within the phase, then let the communication terminal device forward the trigger signal to the other two monitoring device in the other two phases.

The apparatus further comprises:

a wireless communication module, for communicating with the other two feeders monitoring device so that a wireless communication is established by time division multiplexing manner with the other two feeder monitoring devices in a corresponding position, and for collecting from the other two feeder monitoring devices the parameters, and for forwarding them to a system master station through the wireless communication network.

The apparatus further comprises:

a power requisition module, which has the ability to obtain electrical power from a closed magnetic circuit by a latching mechanism so to supply power to the feeder monitoring device;

a power management module, for controlling the power requisition module, and for providing battery-backup power supply;

a power level control module, for leveling the power consumption by the power requisition module.

The apparatus further comprises a feeder clamping member using springs, a line support and a locking means, for clamping to the feeder line between the line support and the springs. The line support can be adjusted for the feeder position. The said feeder clamping member can hold the feeder in tight closure after clamping to the feeder by the locking means.

A low current single-phase ground fault detection and location system, including the said feeder monitoring device and a fault location unit, having:

the fault location unit, for based on the synchronously collected voltage and current signals, to calculate for the three-phase feeder sat plurality of positions, the corresponding zero-sequence voltage and zero-sequence current, as well as to extract at the various locations on three-phase feeder steady state and transient signals from the zero-sequence voltage and zero-sequence current; based on the steady signal of the zero-sequence voltage and zero-sequence current to determine the line for which a ground fault has occurred; and based on the transient signal on the zero-sequence voltage and zero-sequence current, to determined that the failure is at a specific fault location on the line.

The fault location unit comprises:

a fault line location module, for extracting stationary signals at various locations, including the zero sequence voltage, zero sequence current, and characteristic values of the steady-state signal; with the characteristic values include: amplitude, average, differential value, integral value or one or more of those; and calculate at the various positions steady zero sequence active power, zero-sequence reactive power; further calculating the steady-state waveform similarity of the zero-sequence voltage and zero-sequence current signals at various locations; and based on differences in the steady-state signal characteristic values and the waveform similarity at each phase line, to determine the selection of the fault line;

a fault point positioning module, for extracting at the respective positions at the fault line indicated by the fault line location module, the zero-sequence voltage and zero-sequence current transient signals; calculating the transient signal characteristic values, with the characteristic values include: amplitude average, differential value, integral value or one or more of those; also calculating at the various positions, the transient zero sequence active power and reactive power zero-sequence; further calculating the waveform similarity of the transient zero sequence voltage and zero-sequence current signals; and determining the ground fault point position based on differences in the transient waveform similarity and the characteristic values at each position.

The system also includes:

a fault display and indication processing unit for after determining the ground fault point, showing it on the geographic information system (GIS) map, and sending a ground fault signal in a wireless communication network to a fault indication unit near the ground fault point for display.

The system may also include:

a communication terminal device for communicating with the feeder monitoring device to relay the received parameters up to the system central unit's fault locating unit.

For each of said communication terminal device and the one or more sets of three of the three-phase feeder monitoring devices, the time division multiplexing method is used to establish wireless communication between a communication terminal device with the feeder monitoring devices. The said communication terminal device and the said system central unit communicate via a wireless communication network.

The system may also include:
a communications terminal equipment, instead of communicating with the set of three-phase feeder monitoring devices above, only communicates directly with any one of the three-phase feeder devices, and transmit all three feeder monitoring devices' parameters up to the system's central fault locating unit; for the collection of parameters from the other two feeder monitoring devices, wireless communication is established between the first feeder monitoring and rest of the two feeder monitoring devices, with time division multiplexing method used; the said communication terminal device and the said system central unit communicate via a wireless communication network.

The system may also include:
a communication terminal embedded feeder monitoring devices that have built-in communication terminal functions; with the communication terminal embedded feeder monitoring devices used to communicate with the other two-phase feeders in the corresponding set; the set uses time-division multiplexing wireless communication to send parameters to the enhanced feeder monitoring device; the communication terminal embedded feeder monitoring devices then forwards the parameters to the system central unit's fault locating unit via a wireless communication network.

From the said technical solution provided above by the present invention, one can understand with the embodiments of the present invention, after a low current single-phase ground fault has occurred, the invention can be used to detect and locate the ground fault, regardless of whether it is low resistance or high resistance grounded, or whether it is a transient ground fault or permanent ground fault, all with effective detection and indication.

BRIEF DESCRIPTION OF THE DRAWINGS

In order to more clearly illustrate the technical solution of the embodiments of the present invention, the following figures are provided. Obviously, the figures are only describing some embodiments of the invention. For one of ordinary skill in the art, other figures can also be obtained based on these figures.

DETAILED DESCRIPTION OF THE INVENTION

Below in connection with the accompanying figures of the present invention embodiment, the present invention will be apparent in the technical implementation of the invention. The described embodiments are only part of the present invention, but not all. The described embodiments of the present invention, and all other embodiments perceived by those of ordinary skill in creativity, all belong to the scope of the present invention.

Below with references to the figures, the present invention is further described in detail.

Figure 1:
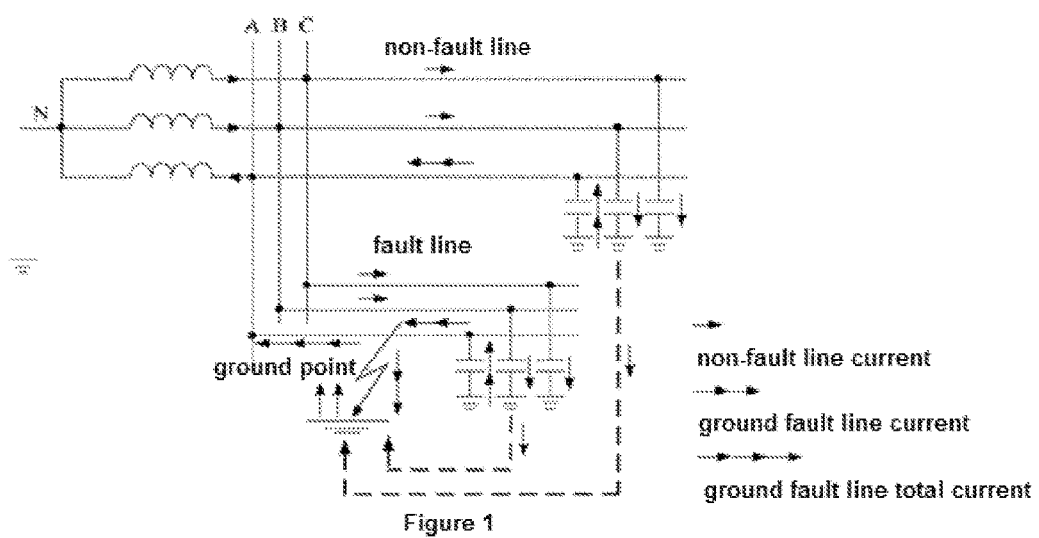
FIG. 1 shows at the neutral point N, the ungrounded single-phase ground fault currents.
Figure 2:
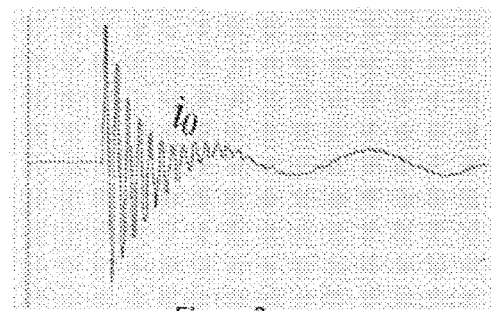
FIG. 2 shows after a single-phase ground occurs, the fault line zero sequence current.
Figure 3:
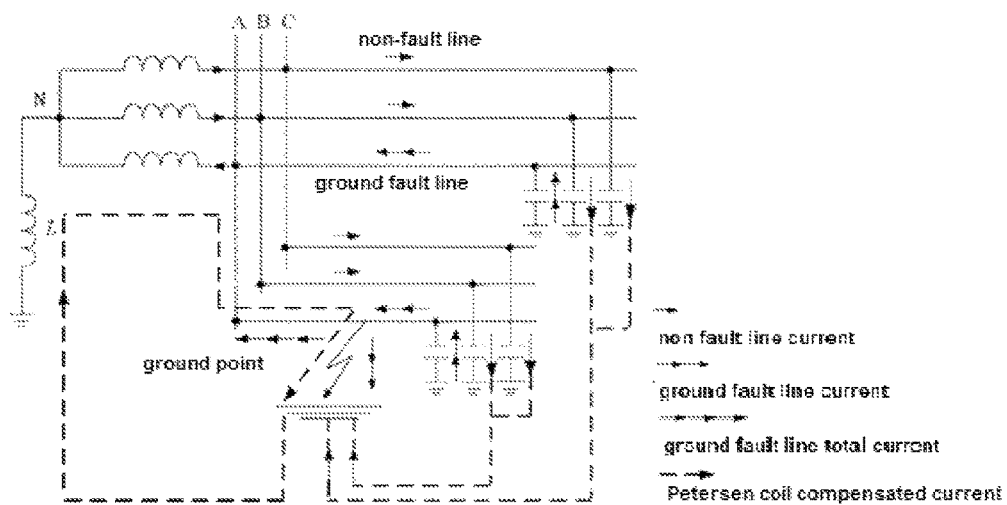
FIG. 3 shows the neutral point N, the Petersen coil grounded single-phase ground fault current.
Figure 4:
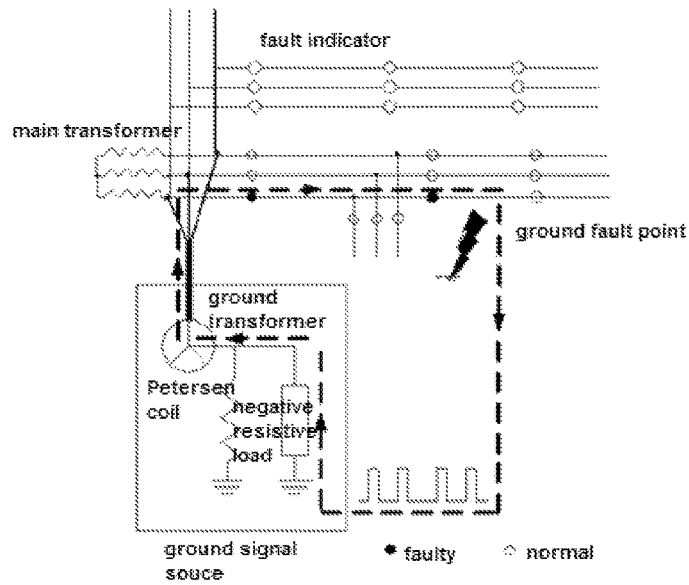
FIG. 4 shows how the injection signal source ground fault detection method works.
Figure 5:
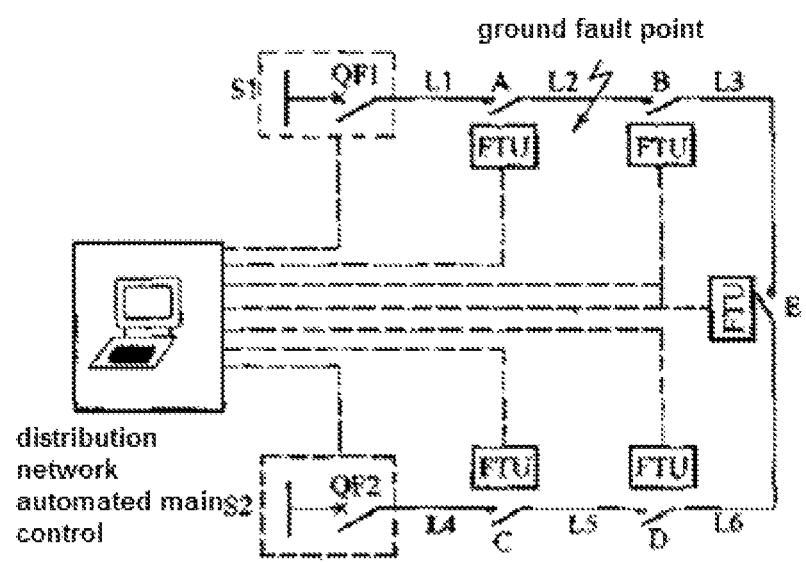
FIG. 5 shows the principle of the networking FTU ground fault detection method.
Figure 6:
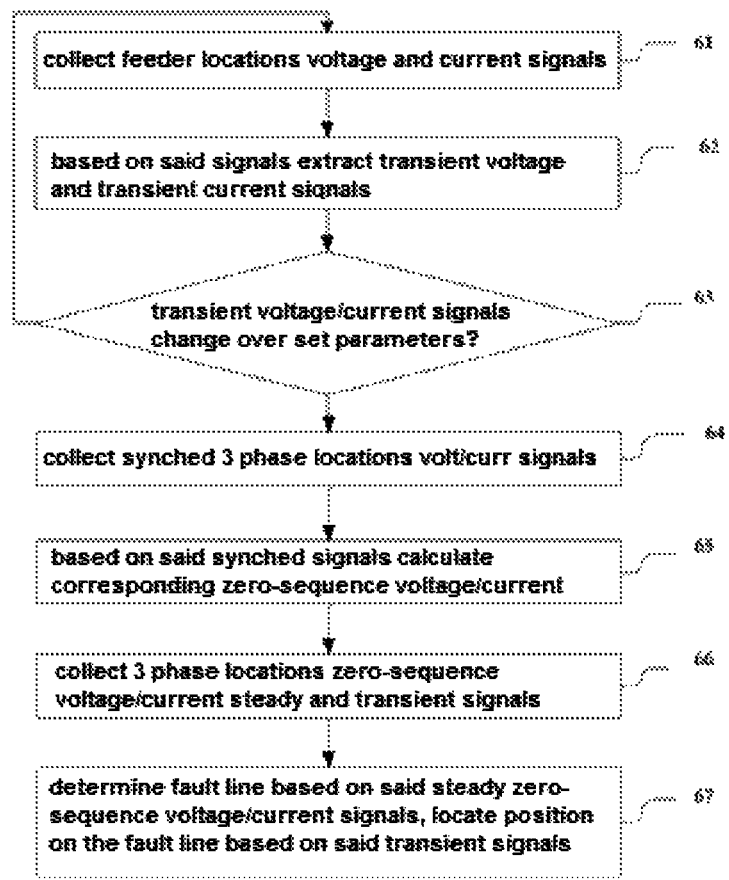
FIG. 6 shows a flow chart of the method invention embodiment.

An embodiment of the present invention is to provide a low current single-phase ground fault detection and location, as shown in FIG. 6, comprising:

At step 61, data collections were made to voltage and current signals for each of a plurality of positions in the feeder;

Specifically at set intervals, periodically the voltage and current signals on each phase feeders are collected at the plurality of positions, or they can be collected at specified times. Alternatively, one can use other ways to set the schedule on each phase feeder to collect voltage and current signals at the plurality of positions.

At step 62, the voltage and current signals are picked up according to step 61 to determine the corresponding transient voltage signals and transient current signals.

Step 63 is to determine the extent of change in the transient voltage signals and the transient current signals. If they exceed a set threshold, then the method proceeds to step 64. Otherwise, it returns to step 61.

Among these steps, the degree of change in the said transient voltage signals and transient current signals comprises:

The transient voltage and current signals from each calculation are used to determine the magnitude, the average value, the differential value and integral value, as the one or more degrees of change. For example, one can calculate the results and compared them between two adjacent positions to determine the extent of the change, or one can calculate the present results and compare with the previous average of multiple calculation results to determine the degree of change, or one can also use other measures in a predetermined manner to determine the degree of change.

Specifically, one can pick up the voltage and current signals with band-pass to get the transient voltage signal and the transient current signal, then extract from the transient voltage signal and transient current signal after band-pass treatment the amplitude, the average, the differential value, the integration value, or any one or more thereof. When one or more of the above values change to exceed a set threshold, with step 64, the suspected fault triggers the ground fault alarm. At step 64, after the degree of change in the transient voltage signal and the transient current signal exceeds a set threshold, the synchronized collection of voltage and current signals at a plurality of positions is triggered at the three-phase feeders.

The mode for the three-phase synchronous collection of feeder voltage and current signals of the plurality of positions may include:

time division multiplexing wireless communication network timing and GPS timing with synchronization; the synchronized pickup of voltage and current signals at the three-phase feeder at the plurality of positions is based on the synchronization of time.

After generating a suspected ground fault alarm, specifically as a trigger by infrared, sound, ultrasound, magnetic or electromagnetic field signals, one feeder will trigger the other two-phase feeders. Specifically, the trigger signal can be directly transmitted to the other two-phase feeders. Alternatively, the first trigger signal is transmitted to an adjacent phase feeder, and then transmitted by the adjacent phase feeder to the other phase feeder. Another alternative is the trigger signal is first sent to the neighboring wireless communication terminal device, and then transmitted via the communication terminal device to other two-phase feeders. Upon receiving the triggers, the other two-phase feeders will upload the voltage and current waveforms signals to be used for calculating the zero-sequence voltage and zero-sequence current signals for detecting ground faults.

At step 65, based on the voltage and current signals picked up at three-phase synchronized feeders at a plurality of positions, the corresponding zero-sequence voltage and zero-sequence current are calculated.

At step 66, the extraction of steady state signals and transient signals is performed on the three-phase feeders at the respective positions, for the zero sequence voltage and zero sequence current.

At step 67, based on the steady state signal the zero-sequence voltage and zero-sequence current, determination is made as to the fault line. And further based on the zero-sequence voltage and zero-sequence current transient signals, determination of the specific position of the fault on the faulty line is made.

At the step 67, the process of using the steady state signals of the zero-sequence voltage and zero-sequence current to determine the fault line may include:

extracting from the steady signals at a plurality of locations the zero sequence voltage and zero sequence current, the characteristic values of the steady state signals, the characteristic values include: amplitude, average, differential value and integral value, or one or more thereof; also calculated are the zero sequence active power and reactive power sequence; further calculated are the similarities from steady-state waveform zero-sequence voltage and zero-sequence current signals at the plurality of locations; determination of fault line based on the difference of steady state signal characteristic values and the waveform similarities from the different phase lines.

At the step 67, based on the zero-sequence voltage and zero-sequence current transient signals, the method to determine the specific position of the fault on the faulty line may include:

extracting from the transient signals at the plurality of locations the zero sequence voltage and zero sequence current, the characteristic values of the transient state signals, the characteristic values include: amplitude, average, differential value, integral value, or one or more thereof; also calculated are the zero sequence active power and reactive power sequence; further calculated are the similarities from transient-state waveform zero-sequence voltage and zero-sequence current signals at the plurality of locations; determination of fault line position based on the differences of the transient state signal characteristic values and the waveform similarities at the plurality of locations.

After performing the above step 67 to determine the ground fault point, the result can be displayed on the map GIS (geographic information system) by sending over a wireless communication network the ground fault information to a fault indication unit for ground fault point display, for inspectors to quickly and easily find the location of the fault.

Figure 7:
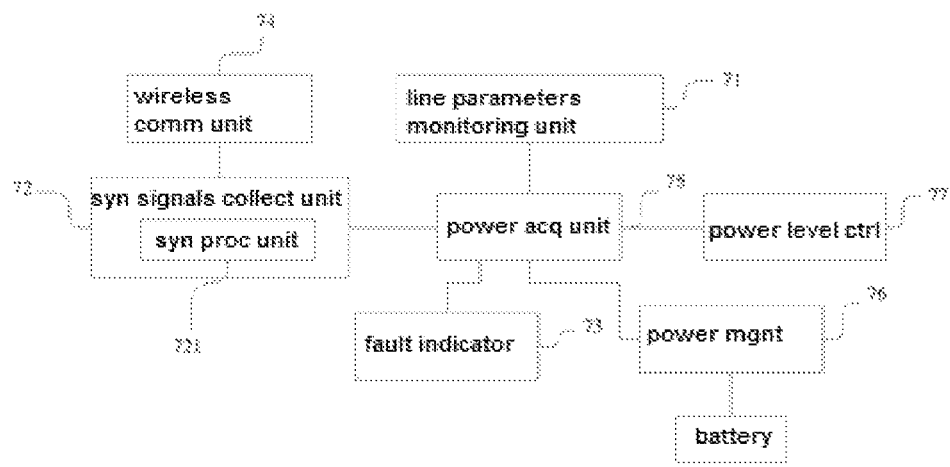
FIG. 7 provides a schematic diagram of the apparatus invention embodiment.

Embodiments of the present invention further provide a feeder monitoring means for installation at a plurality of locations on each phase of the feeders. The specific structure is shown in FIG. 7, which may include:

a feeder parameter monitoring module 71 for monitoring and collecting of the voltage and current signals on each phase feeders at a plurality of locations, and based on the data for calculating the corresponding transient voltage signal and the transient current signal, and based on noticing the degree of change from the transient voltage signal and transient current signal exceeds a set threshold, for notifying the feeder monitoring device from the adjacent phase feeder to perform the signal synchronization module 72.

Signal synchronization pickup module 72 is for receiving notice sent by the feeder parameter monitoring module on the adjacent monitoring device to facilitate synchronized collection of voltage and current signals on the feeder. Doing so is for achieving the synchronized collection of voltage and current signals from the three-phase feeders, and for reporting the data to the system central unit. The signal synchronization module 72 specifically includes a synchronization processing module 721. The synchronization process module 721 performs timing synchronization by time division multiplexing wireless communication network timing and GPS timing, and thus ensures the signal synchronization pickup module 72 can be based on the synchronized time for collection from the corresponding position all three-phase feeders the voltage and current signals.

Further, the apparatus may further include a fault indication module 73 for after determining there is a ground fault, to indicate where the fault is located. For example, the fault indication module can light up a corresponding indicator for inspectors to notice the fault position. As for the indicator, wide angle bright LED lights can be specifically used in all directions to ensure the maximum attraction in 360 degree coverage, and can be further configured with different numbers of diodes, flashing sequence and frequency to indicate the different types of fault.

In the feeder monitoring devices, the corresponding parameter monitoring module 71 can specifically use capacitive voltage sensors to pick up the voltage signal, and use electronic current sensors to pick up the current signal. The electronic current sensors include: current transformer, wound Rogowski coil or printed circuit Rogowski coil, and the like. When the feed line parameter monitoring module 71 detects that the degree of change in the transient voltage signal and transient current signal as exceeding a set threshold, it places the infrared, sound, ultrasound, or magnetic field signal as a trigger signal to trigger the synchronization signal pickup module 72. The specific method of notification that may be employed includes any of the following:

method one: the trigger signal is transmitted directly to the feeder monitoring device on the other two phase feeders for the signal synchronization module 72;

method two: the first trigger signal is transmitted to the monitoring device in an adjacent phase, addressing the second signal synchronization module 72, and then from the adjacent monitoring device, to the third phase feeder monitoring device, addressing the third signal synchronization module 72;

method three: first, the trigger signal is transmitted to the communication terminal apparatus, and from there, relayed to the other communication terminal devices at the other two phases, and from there, to the other two monitoring devices, for the corresponding signal synchronization modules 72.

Specifically, the said feeder monitoring device may further comprise:

a wireless communication module 74, for communicating with the other two phase feeder monitoring devices that correspond to a location, to establish wireless communication by time-division multiplexing, and send together including the parameters from the other two phases, to the system central unit via a wireless communication network, with the parameters include feeder current and voltage signals, feeder temperature, and the like.

Specifically, the said feeder monitoring device may further comprise:

a power requisition module 75, which has the ability to obtain electrical power from a closed magnetic circuit by a latching mechanism so to supply power to the feeder monitoring device;

a power management module 76 for controlling the power requisition module 75 to obtain electrical power to power the feeder monitoring device, and to obtain power from a battery as a backup power supply, such that when the power supply is normal, to obtain power from the feeder, and when the feeder cannot supply normal power, to obtain power from the battery, in order to ensure proper power supply to the feeder monitoring device.

The power level module 77 is for controlling power requisition module 75 to obtain a leveled electrical power so to supply a constant power to the feeder. The power level module can draw power from the feeder to ensure that the power is available when a low but sufficient current is flowing. It can continue to draw power when a large but not yet saturated current is flowing.

For ease of understanding, a specific implementation structure of the feeder monitoring device will be described below.

Figure 8:
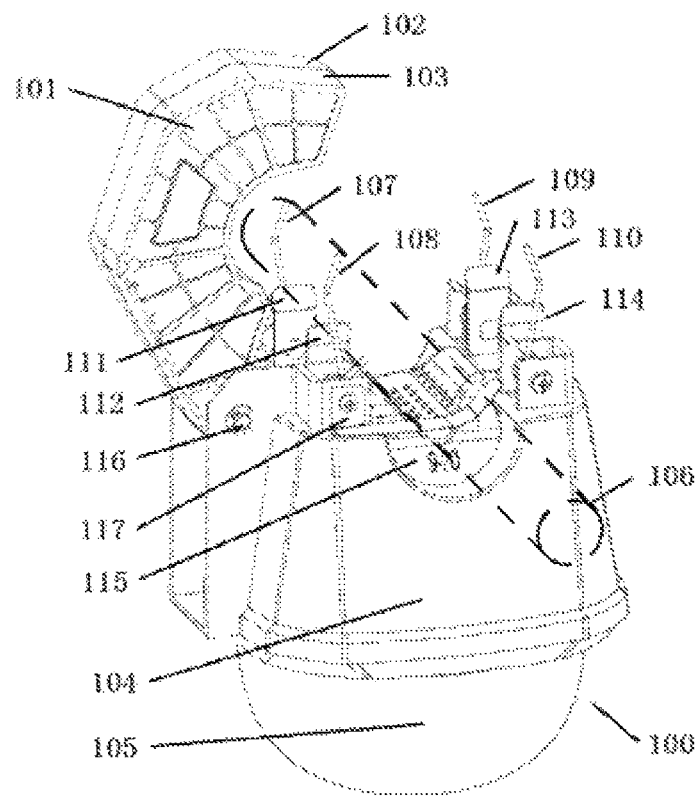
FIG. 8 shows the apparatus invention embodiment in the open state before being clamped to the feeder by clamping mechanism.

Specifically, as shown in FIG. 8, the structure is pertaining to the feeder monitor device 100 (i.e., feeder monitoring unit) in an open state before being installed with a clamping mechanism in a schematic view. The feeder monitoring apparatus comprises housing 100, an upper arm 101, the main body 104, and a lower transparent housing 105. The upper arm 101 has two halves: 102 and 103. 102 contains part of the electronic current sensor. 103 contains part of the power acquisition module (i.e., the power management module 75 and the power level control module 76). The remaining part of the power acquisition module (including the power management module 75), the remaining part of the electronic current sensor, wireless synchronization trigger means (i.e. synchronization processing module 721), the wireless communication apparatus (i.e., wireless communication module 74), processing means (i.e., parameter monitoring feeder module 71), the fault indicating device (i.e. fault indication module 73) are located within the main body 104. Fault indicator lights are emitted through the lower transparent housing 105. Each module can be specifically sealed into the main body 104 by using sealant.

The main component of the feeder power acquisition module within the monitoring device 100 is a closed magnetic circuit having a magnetic element, such as a circular or other similar closed magnetic circuit having a magnetic element. In order to for the magnetic circuit to surround the distribution feeder 106, the magnetic element is cut into two parts, one is located in the upper arm 103, the other is located within the body 104. To draw power with a coil wound on the magnetic element, the power level control circuit is connected to the coil (i.e., the power level control module 76). In order to allow drawing enough power in the distribution feeder apparatus 106 even on a very low current flow, the two parts of the magnetic element are closed with locking to achieve a tightly closed magnetic circuit. The locking device consists of a closed lock spring located in the upper arm shaft 116, a damper and a magnetic element located in the upper arm 103 as pressing spring. The closed lock spring keeps the arm and the body in close contact. The damper can slow the locking arm during impact force. The magnetic member in 103 of the upper arm and magnetic member of 104 of the man body would achieve snug contact by the pressing spring element.

A traditional means for drawing power works if the current that flows through the distribution feeder 106 is low enough, and would be able to get the power supply device 100 operated. But when a very large distribution current is flowing through the feeder 106, the magnetic element is saturated. The traditional means cannot get enough electricity. Therefore, be able to draw power from the distribution feeder 106 if the current flowing through is large, the magnetic element is made not to be saturated. But such modification would not work when the current flowing through the distribution feeder 106 is low, because there is not enough power to feed to the monitoring device 100's operation. By using the power level control circuit of the present invention, magnetic element can draw enough power from the distribution feeder 106 even when the current flowing through it is low to supply the power to the feeder monitoring device 100. When the current flowing through the distribution feeder 106 is large, the power level control circuit can prevent the magnetic element from being saturated, therefore, still be able to supply enough power to the feeder monitoring device 100.

The power management unit within the feeder monitoring device 100 will convert the power from the power acquisition unit to the device's operating power. But when the distribution feeder power is off or when the power is not enough, the power management unit automatically switches to the backup battery power. When the distribution feeder has enough power again, the power management unit automatically switches back again to draw power from the feeder.

Feeder monitoring device 100 can specifically incorporate an integrated voltage and temperature sensor 117 for voltage and temperature signals. Sensor 117 is made of stainless steel, and is in close contact with distribution feeder. The material has good electrical conductivity and thermal properties, so it can pick up the voltage signal on the feeder and at the same time also can transfer heat to the thermal sensing element.

Feeder monitoring device 100 picks up current signal by an electronic current sensor. The electronic current sensor may be a current transformer CT, such as wound Rogowski coil, or a printed circuit board type Rogowski coil. The magnetic circuit electronic current sensor is partially located in the upper arm 102, with the other portion located within the body 104.

Feeder monitoring device 100 is clamped onto the feeder by a holding means. In the case of using an electronic Rogowski coil current sensor, the feeder would be in the center of Rogowski coil magnetic circuit. The feeder monitoring device 100 holding means is comprised of four latching wire springs 107, 108, 109, 110, and four spring pins 111, 112, 113, 114 for fixing the springs, as well as wire bracket 115.

Figure 9:
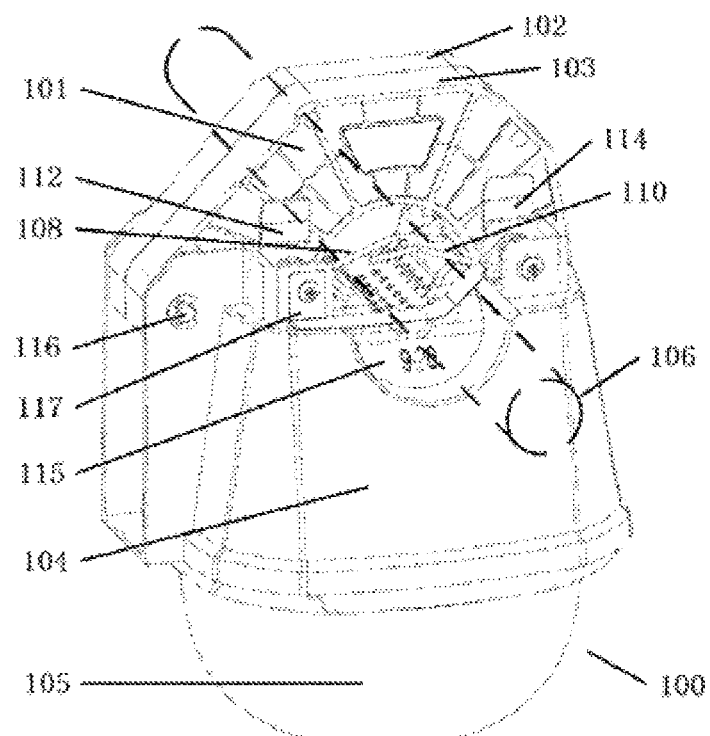
FIG. 9 shows the apparatus invention embodiment in the closed state after being clamped to the feeder by clamping mechanism.

Referring to FIG. 9, the schematic is showing the structure of the feeder monitoring device 100 in accordance with one embodiment of the present invention being in a locked state using the holding means. In the locked state, the holding means' four springs 107, 108, 109, 110 hold staggered and tightly onto the feeder 106, with feeder 106 being fixed to the wire bracket 115.The power acquisition means' two portions of the magnetic element would achieve snug contact with each other. The same can be said that the feeder 106 is now located in the center of the closed magnetic circuit current sensors, with the integrated voltage temperature sensor 117 and the distribution feeder 106 to achieve a snug fit.

Figure 10:
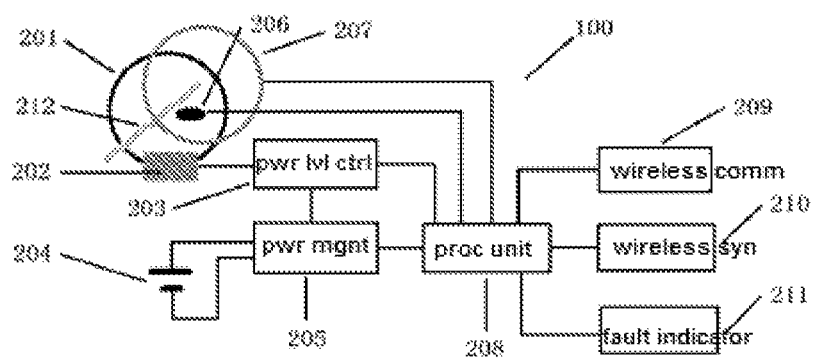
FIG. 10 shows a schematic diagram of the apparatus which implements many features.

According to another embodiment of the structure of a feeder monitoring device 100 of the present invention as shown in FIG. 10, the embodiment is comprising: an electrical coil 202 is wound on the electromagnetic power acquisition element 201, the feeder 212 is located in the center of the magnetic circuit of the magnetic elements, with coil 202 connected to the power level control device 203 (i.e., the power control module 76), with the battery 204 and the power acquisition control circuit 203 connected to power management device 205 (i.e., the power management module 75). Power supply means 205 takes the power output from the power level control device 203 and the output of battery source 204,and converts them into the needed power for the feeder monitoring device 100, as well as switches between the power level control unit 203 and battery 204.

The processing device 208 (i.e. the feeder parameter monitoring module 71) is for collecting from the integrated voltage and temperature sensor 206 the voltage signal voltage signal, and for processing the signal in band-pass to derive the transient voltage signal. It extracts the amplitude, average, differential value, integral value of the transient voltage signal and combinations thereof. When a change in the value of one or more parameters exceeds the threshold, it triggers an alarm for the suspected ground fault.

The processing means 208 also collects from the electronic current sensor 207 the current signal, and processes the current signal in band-pass to derive the transient current signal. It extracts the amplitude, average, differential value, integrated value of the transient current signal and combinations thereof. When a change in the value of one or more parameters exceeds the threshold, it triggers an alarm for the suspected ground fault.

After the processing means 208 triggers a suspected ground fault alarm, it immediately triggers the synchronization device 210 via a wireless trigger to the other phase feeder monitoring devices 100.

The processing apparatus 208 is using the wireless communication device 209 to externally establish time division multiplexing wireless communication, and to synchronize time, to ensure any phase monitoring device 100 is in synced with the other phase feeder monitoring devices monitoring unit 100.

The feeder monitoring device 100 further comprises an indicator means 211 (i.e., fault indication unit) for indicating a local ground fault.

Figure 11:
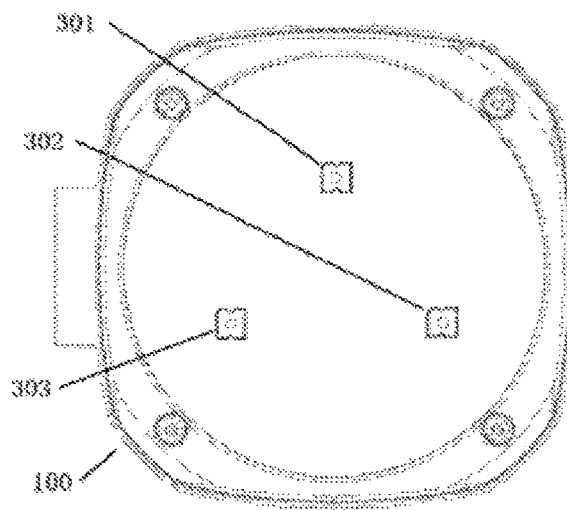
FIG. 11 shows a schematic diagram of apparatus implementing the fault indication unit.

According to another embodiment of the structure of a feeder monitoring device 100 of the present invention as shown in FIG. 11, the embodiment comprises of a fault indication means. The fault indication means may use three wide-angle LEDs 301, 302, 303, spaced at 120 degrees apart. Upon receipt of a ground fault signal, it uses different intervals and different flashing patterns to indicate different types of ground fault.

Figure 12:
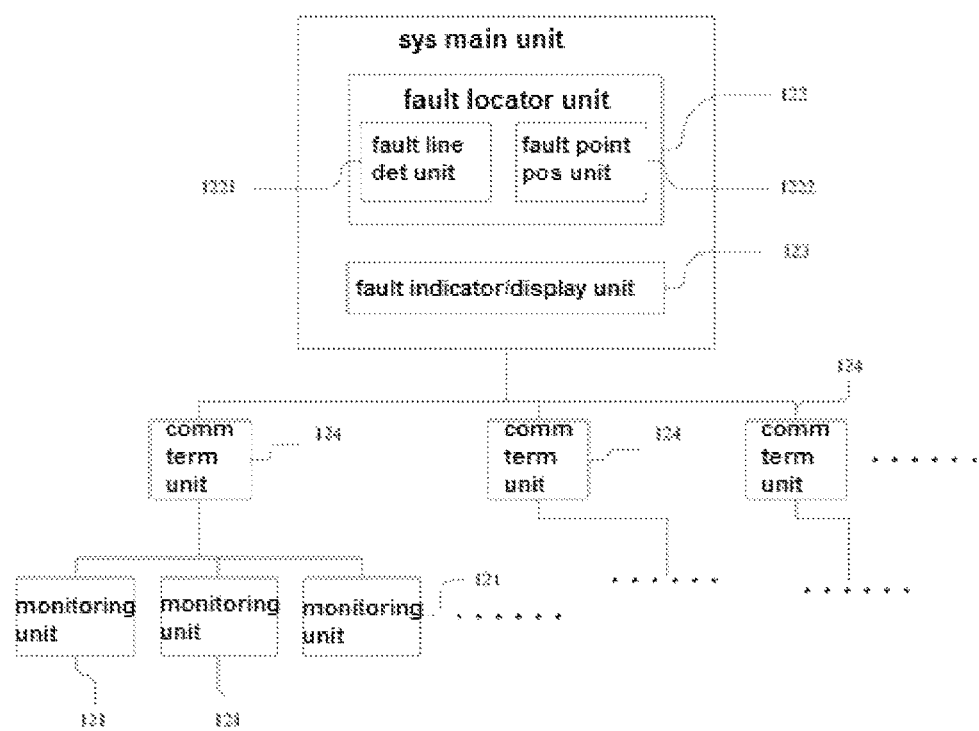
FIG. 12 shows a schematic diagram of the system invention embodiment.

According to an embodiment of the low current single-phase ground fault detection and location feeder monitoring system, as shown in FIG. 12, the embodiment specifically includes the said feeder monitoring device 121, and fault location unit 122.

The fault location unit 122 is used to calculate the zero-sequence voltage and the zero-sequence current based on the synchronously collected voltage and current signals at the plurality of locations on the three-phase feeder lines. It also collects the steady-state and transient signals based on the zero-sequence voltage and zero-sequence current on the three-phase feeders at each location. Based on the steady-state signals from the zero-sequence voltage and the zero-sequence current, it can decide which the fault line is. Similarly, based on the transient signals from the zero-sequence voltage and the zero-sequence current, it can decide where the specific fault on the line is. The fault locator unit specifically can be set up at the system central unit. The system central unit and feeder monitoring devices communicate over remote communication means. Such communication is based on one -to-many communication networking.

In particular, the fault location unit may comprise:

fault line module 1221 for extraction from the steady signals at various locations the zero sequence voltage and zero sequence current, the characteristic values of the steady state signals, the characteristic values include: amplitude, average, differential value and integral value, or one or more of those, as well as the zero sequence active power and reactive power sequence, and calculation of the similarity from steady-state waveform zero-sequence voltage and zero-sequence current signals at the various locations; determination of fault line based on the differences in the steady state signal characteristic values and the waveform similarity; and fault line positioning module 1222 for extracting at the respective positions at the fault line the zero-sequence voltage and zero-sequence current transient signals fault location module, calculating the transient signal characteristic values, with the characteristic values include: amplitude average, differential value and integral value of one or more of the various positions' transient zero sequence active power and reactive power zero-sequence, also calculating the waveform similarity of the transient zero sequence voltage and zero-sequence current signals, and determining the ground fault point based on differences in the transient waveform similarity and the characteristic values at each position.

Further, the system may also include a fault indication display and indication processing unit 123, located at the system central unit, for after determining the fault line position, showing it on the geographic information system (GIS) map, and sending a ground fault signal in a wireless communication network to a fault indication unit at the ground fault point display to show the ground fault, so to not only show the ground fault location at the system central unit, but also show at the ground fault point that a local ground fault has occurred, in order to let inspectors easily discover the location of a ground fault.

In order to facilitate communication between feeder monitoring device the system central unit, the system may also include a communication terminal device 124. The corresponding communication terminal device 123 may be used to achieve one of the following specific processes.

(1) Process for the feed line monitoring device communication: to transmit the feeder monitoring parameters (such as voltage and current signals, etc.) to the system central unit's fault location unit, with each of the said terminal devices is for communicating with the one or more sets of 3 of the three-phase feeder monitoring devices, based on the time division multiplexing method to establish wireless communication between a communication terminal device and the feeder line monitoring devices, with the said communication terminal communicates with the said system central unit via a wireless communication network.

(2) Process for communicates directly with any one of the three-phase feeder devices, and transmit all three feeder monitoring devices' parameters up to the system's central fault locating unit. In order to collect parameters from the other two feeder monitoring devices, wireless communication is established between the feeder monitoring and rest of the two feeder monitoring devices, with time division multiplexing method used. The said communication terminal device and the said system central nit communicate via a wireless communication network.

With the said communication terminal equipment, the parameters from the feeder monitoring devices can be easily transmitted to the system central unit for the system central unit's fault location unit to perform ground fault location process.

The said system can also include feeder monitoring devices that have built-in communication terminal functions, for communicating with the other two-phase feeders in the corresponding set, by time-division multiplexing wireless communication, so to collect parameters from the other two feeder monitoring devices. The said feeder monitoring devices with built-in communication terminal functions communicate via a wireless communication network with the said system central unit, and send the three-phase feeder parameters to the system central unit's fault locating unit Based on the above said low current grounded single-phase ground fault detection and location system, the present invention provides an embodiment on low current grounded single-phase ground fault detection and location process, with the following specific steps:

Step one, install feeder monitoring devices (i.e. feeder monitoring devices) on the three-phase distribution network feeders, with feeder monitoring device drawing power from the feeder controlled by power level, with battery as a backup power supply.

Step two, the feeder monitoring devices pickup from each phase the voltage signals through capacitive voltage sensors, and pick up from each phase the current signals through electronic current sensors.

Step three, each phase feeder monitoring device processes the collected voltage signals and band-pass current signals to extract the transient voltage signals and current signals and calculates the amplitude, the average, the differential value, the integral value and their combinations, when a change in the one or more values exceeds a predetermined threshold, triggers a suspected ground fault alarm.

Step four, after the fault line phase feeder monitoring device triggers the suspected ground fault alarm, based on a wireless synchronization trigger (i.e. trigger signal), notify the other two phases to upload voltage and current waveform data.

Step five, after the other two-phase feeder monitoring devices receive the trigger signal, using time-division multiplexing wireless communication network timing and GPS timing, to accurately achieve time matching—meaning timing synchronization.

Step six, based on time division multiplexing in wireless communication networks, collect feeder voltage and current waveform data for each corresponding position in the three-phase feeders, and calculate for each position the zero-sequence voltage and zero-sequence current.

Step seven, extract at each position the zero-sequence voltage and zero-sequence current for the steady state signals, calculate the characteristic values, with the characteristic values include: amplitude, average, differential value, integral value and a combination of those; also calculate the steady zero sequence active power, zero-sequence reactive power; calculate further the steady-state waveform similarity of the zero-sequence voltage and zero-sequence current signals; and based on differences in the steady-state zero-sequence voltage, zero-sequence current characteristic values and waveform similarity for fault line and non-fault lines, perform selection of the fault line and non-fault lines.

Step eight, extract at each position the zero-sequence voltage and zero-sequence current for the transient signals, calculate the characteristic values, with the characteristic values include: amplitude, average, differential value, integral value and a combination of those; also calculate the steady zero sequence active power, zero-sequence reactive power; calculate further the transient state waveform similarity of the zero-sequence voltage and zero-sequence current signals; and based on the before fault and after fault locations the differences in the transient zero-sequence voltage, zero-sequence current characteristic values and waveform similarity, analyze for each point, especially with priority for the selected points at the suspected fault line, to determine the ground fault point.

Step nine, at the determined ground fault point, combined with GIS (geographic information system, geographical information system) to show the ground fault point on the map; at the same time issued a ground fault signal to the feeder monitoring unit's fault indication module to show indication, so that the inspectors can locate the ground fault.

In the low current grounded single-phase ground fault detection and location system, the components of the system can include the feeder monitoring units, the communication terminals (i.e. the communication terminal equipment) and the system central unit. Each communication terminal can connect one or more sets of three-phase feeder monitoring units. Each communication terminal and the three-phase feeder monitoring units communicate using time division multiplex wireless communication method, forming a wireless communication network. The communication terminal and the system central unit communicate over wireless communication network, such as GSM/GPRS, CDMA, and WIFI Ethernet, etc.

Alternatively, the said components of the system may include only the feeder monitoring units and the system central unit. In such system, one of the feeder monitoring units in the three-phase feeders (such as the feeder monitoring unit at the B-phase feeder) functions simultaneously as a communication terminal. It communicates with the other two phase monitoring units by time division multiplexing wireless communication method, forming a wireless communication network. At the same time, this feeder monitoring unit and the system central unit communicate over wireless communication network, such as GSM/GPRS, CDMA, and WIFI Ethernet, etc.

Alternatively, the said components of the system may include the feeder monitoring units, the communication terminals and the system central unit. In such system, one of the feeder monitoring units in the three-phase feeders (such as feeder monitoring unit at the B-phase feeder) communicates with the other two phase monitoring units by time division multiplexing wireless communication method, forming a wireless communication network. At the same time, this feeder monitoring unit and the communication terminal communicate by time division multiplexing wireless communication method in another frequency, forming another wireless communication network, with each communication terminal communicating to multiple feeder monitoring units. The communication terminal and the system central unit communicate over wireless communication network, such as GSM/GPRS, CDMA, and WIFI Ethernet, etc.

In the system, if the system central unit and the communication terminals are using GPS timing, for the feeder monitoring units to communicate to the communication terminals, it can use GPS timing. Normally when the feeder monitoring units use time division multiplexing wireless communication network to synchronize time, with the additional use of GPS timing together with the time division multiplexing wireless communication network timing synchronization, one can achieve a precise system timing synchronization.

For ease of understanding, in conjunction with the following figures, the said system ground fault location process is described in detail.

Figure 13A:
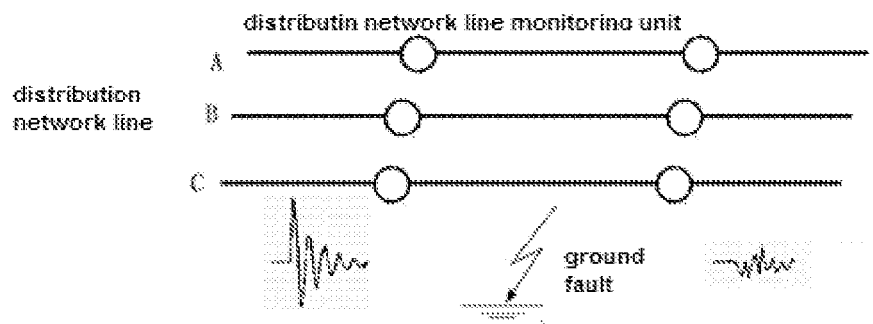
FIG. 13A shows how a single-phase ground fault will trigger the feeder monitoring unit to monitor the transient voltage, and how the current dramatically changes.

As illustrated in FIG. 13A, when a low current grounded distribution feeder with a single-phase ground fault occurs, during the ground fault transient process, the voltage and current on both sides of the ground fault change dramatically within a very short period of time, and produce abnormal transient voltage and current signals.

The system's distribution network feeder monitoring units use capacitive voltage sensors, thus do not produce PT (voltage transformer) ferromagnetic resonance problems, therefore, they can reliably pick up the transient voltage signals. The system feeder monitoring units use electronic current sensors for current measurement, with high accuracy and good linearity, so that the measurement of low currents and large currents would have a high precision. In case of large current, because it is not saturated, transient characteristics are good, therefore, the units can reliably pick up the transient current signal. Thus, in the single-phase ground fault transient process of a low current grounded distribution feeder, because in the faulty phase the distribution feeder monitoring units use the capacitive voltage sensors and the electronic current sensors, they can detect anomalies in the transient voltage signals and the transient current signals.

Figure 13B:
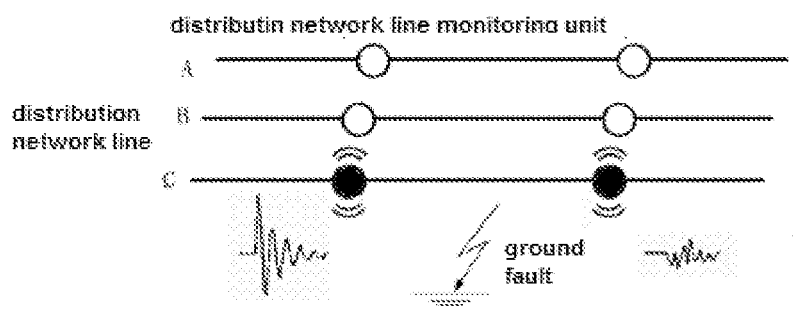
FIG. 13B shows after the feeder monitoring unit detects the suspected ground fault, it synchronously triggers other similar feeder monitoring units via wireless.

As illustrated in FIG. 13B, in the distribution network faulty phase (i.e. C phase), after the feeder monitoring unit detects the suspected ground fault, it synchronously triggers (by sending a trigger signal to trigger) through wireless, a synchronized upload of the monitored voltage and current waveform data, from other phases' feeder monitoring units. Referring to FIG. 13B, after a ground fault occurs at a C phase position, the adjacent two C phase feeder ground fault monitoring units will detect the suspected ground fault, and will send to at their respective corresponding positions of the other two phases (i.e., A and B phase) those feeder monitoring units, the trigger signal.

Figure 13C:
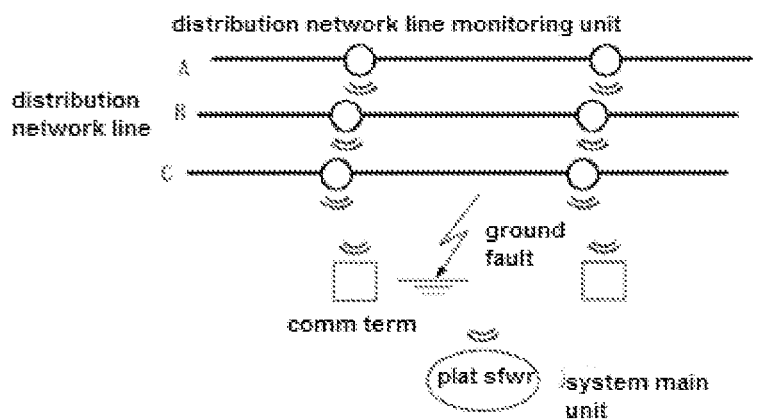
FIG. 13C shows using wireless communication transmission, the voltage and current waveform data of three-phase feeder monitoring unit can be sent to the communication terminal, and then be uploaded to the system central unit.

As illustrated in FIG. 13C, a three-phase distribution feeder monitoring units can transmit the voltage and current waveform data via wireless communication. Specifically, the voltage and current waveform data of the three-phase feeder monitoring unit scan be transmitted to the communication terminal, or by way of first converge the voltage and current waveform data elements from two of the three-phase feeder monitoring units to the third phase feeder monitoring unit, follow by using the communication terminal or that feeder monitoring unit to upload the voltage and current waveform data to the system central unit's platform software, in order for the system central unit's platform software to perform the corresponding ground fault point locating processing.

Figure 13D:
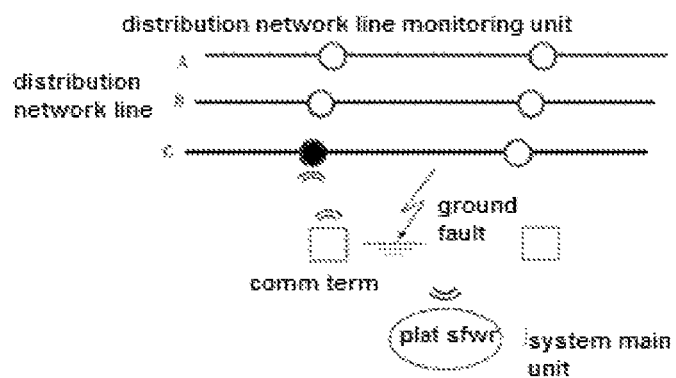
FIG. 13D shows the system central unit's platform software, after making the ground fault detection, issues a ground fault signal to the distribution network feeder monitoring unit positioned before the fault to indicate the fault location.

As illustrated in FIG. 13D, the system central unit's platform software performs the fault detection and location, and issues the ground fault signal to indicate the fault position, with the following specific procedures:

(1) After obtaining from the three-phase feeder monitoring units at multiple locations the voltage and current waveform data, calculate the zero-sequence voltage and zero-sequence current waveform;

(2) At the system central unit's platform software, from the calculated zero-sequence voltage and zero-sequence current at each position, extract at each position the zero-sequence voltage and zero-sequence current for the steady state signals, calculate the characteristic values, with the characteristic values include: amplitude, average, differential value, integral value and a combination thereof; also calculate the steady zero sequence active power, zero-sequence reactive power; calculate further the steady-state waveform similarity of the zero-sequence voltage and zero-sequence current signals; and based on differences in the steady-state zero-sequence voltage, zero-sequence current characteristic values and waveform similarity between fault line and non-fault lines, perform selection of the fault line and non-fault lines;

(3) At the system central unit's platform software, from the calculated zero-sequence voltage and zero-sequence current at each position, extract at each position the zero-sequence voltage and zero-sequence current for the transient signals, calculate the characteristic values, with the characteristic values include: amplitude, average, differential value, integral value and a combination of those; also calculate the steady zero sequence active power, zero-sequence reactive power; calculate further the transient state waveform similarity of the zero-sequence voltage and zero-sequence current signals; and based on the before fault and after fault locations the differences in the transient zero-sequence voltage, zero-sequence current characteristic values and waveform similarity, analyze for each position, especially with priority for selected positions at the suspected fault line, to determine the ground fault point;

(4) After the system central unit's platform software positioning the ground fault point, the result can be set to have a manual secondary review (i.e., manual review by a manual review interface) to further accurately determine the final ground fault position. The result is displayed on the GIS map for the ground fault point. At the same time the system central unit's platform software system by time division multiplexing wireless communication network, issues a ground fault signal to the feeder monitoring unit to indicate the ground fault, so to conveniently allow manual line trace to locate the ground fault position.

Through the above steps (1) through (4) of the process, it can easily and accurately achieve power distribution feeder network ground fault positioning with precision.

Before the system central unit conducts the ground fault positioning process, referring to FIG. 13B, the feeder distribution network fault monitoring unit will detect the suspected ground fault. At that time, it can be synchronized to trigger the other phase feeder monitoring units to synchronously upload wirelessly the monitored voltage and current waveform data.

Figure 14A:
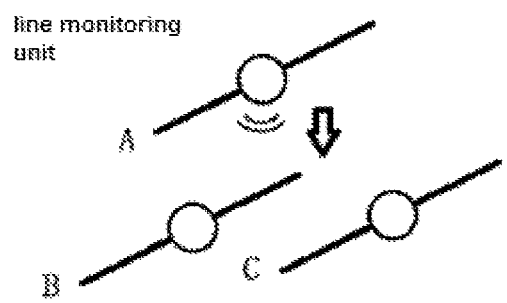
FIG. 14A shows how phase A will trigger both phase B and phase C synchronously over wireless.
Figure 14B:
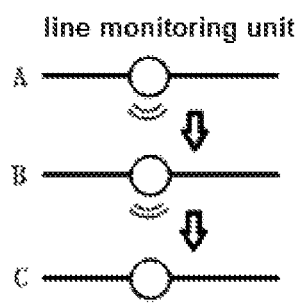
FIG. 14B shows how phase A will trigger phase B, and then phase B will trigger phase C synchronously over wireless.
Figure 14C:
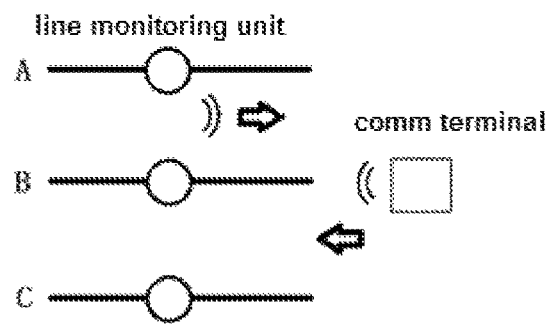
FIG. 14C shows how the phase A will trigger the communication terminal first, before the communication terminal will trigger phase B and phase C synchronously over wireless.

The synchronization process wirelessly triggered by the corresponding feeder monitoring unit specifically can use infrared, sound, ultrasonic, magnetic or electromagnetic field, with any one or combination thereof, sent a trigger signal to the other two phases. At the same time, that first feeder monitoring unit can also receive wireless synchronization trigger signal. The wireless synchronization trigger may include the following types:

(1) As shown in FIG. 14A, assume that the A-phase feeder monitoring unit detects the suspected ground fault, the A-phase feeder monitoring unit via a synchronous wireless triggering device, triggers synchronously the B-phase feeder monitoring unit and the C-phase feeder monitoring unit;

(2) As shown in FIG. 14A, assume that the A-phase feeder monitoring unit detects the suspected ground fault, the A-phase feeder monitoring unit via a synchronous wireless triggering device, triggers synchronously the B-phase feeder monitoring unit, and follows by the B-phase feeder monitoring unit triggers synchronously via wireless the C-phase feeder monitoring unit;

(3) As shown in FIG. 14C, assume that the A-phase feeder monitoring unit detects the suspected ground fault, the A-phase feeder monitoring unit via a synchronous wireless triggering device, triggers synchronously the communication terminal, follows by the communication terminal triggers synchronously via wireless the B-phase feeder monitoring unit and the C-phase feeder monitoring unit.

Figure 15A:
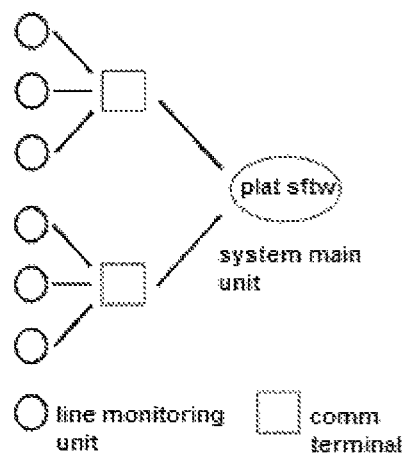
FIGS. 15A, 15B, 15C, and 15D show the four embodiments of the system invention.

The topology structure of the system according to an embodiment of the present invention can be referred to FIGS. 15A to 15D, wherein:

Structure I: As shown in FIG. 15A, the corresponding system topology comprises: the feeder monitoring units, the communication terminal and the system central unit. Each communication terminal is connected to a set of three-phase feeder monitoring units. The communication terminal and the three-phase feeder monitoring units communicate using time-division multiplexing wireless communication, forming a wireless communication network. The communication terminal and the system central unit communicate over GSM/GPRS, CDMA, and WIFI Ethernet. The system central unit and the communication terminals are using GPS timing. The communication terminal and the feeder monitoring units use time division multiplexing wireless communication network to synchronize time, so to finally achieve precisely synchronized system timing.

Figure 15B:
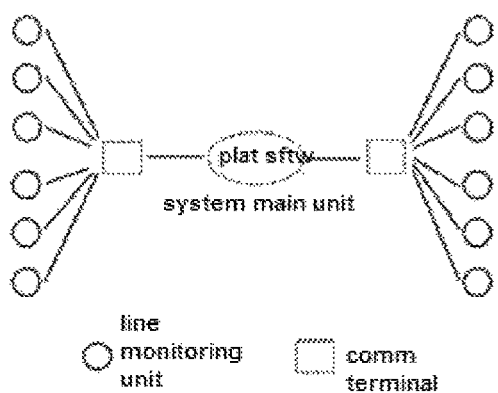

Structure II: As shown in FIG. 15B, the corresponding system topology comprises: the feeder monitoring units, the communication terminal and the system central unit. Each communication terminal is connected to multiple sets of the three-phase feeder monitoring units, with FIG. 15B showing the communication terminal is connected to two sets of the three-phase feeder monitoring units. The communication terminal and the multiple sets of three-phase feeder monitoring units communicate using time-division multiplexing wireless communication, forming a wireless communication network. The communication terminal and the system central unit communicate over GSM/GPRS, CDMA, and WIFI Ethernet. The system central unit and the communication terminals are using GPS timing. The communication terminal and the feeder monitoring units use time division multiplexing wireless communication network to synchronize time, so to finally achieve precisely synchronized system timing.

Figure 15C:
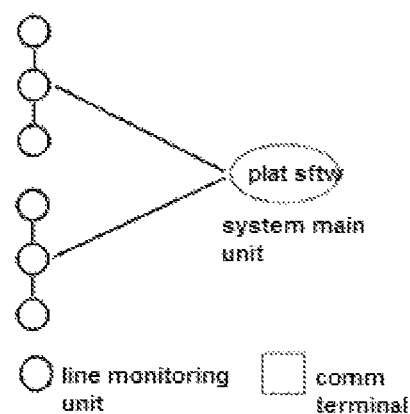

Structure III: As shown in FIG. 15C, the corresponding system topology comprises: the feeder monitoring units, and the system central unit. One of the three-phase monitoring units such as B-phase unit would also function as a communication terminal, and communicates to the other two phase feeder monitoring units using time-division multiplexing wireless communication, forming a wireless communication network. This feeder monitoring unit and the system central unit communicate over GSM/GPRS, CDMA, and WIFI Ethernet. The system central unit and the communication terminals are using GPS timing. This communication terminal/feeder monitoring unit and the other feeder monitoring units use time division multiplexing wireless communication network to synchronize time, so to finally achieve precisely synchronized system timing.

Figure 15D:
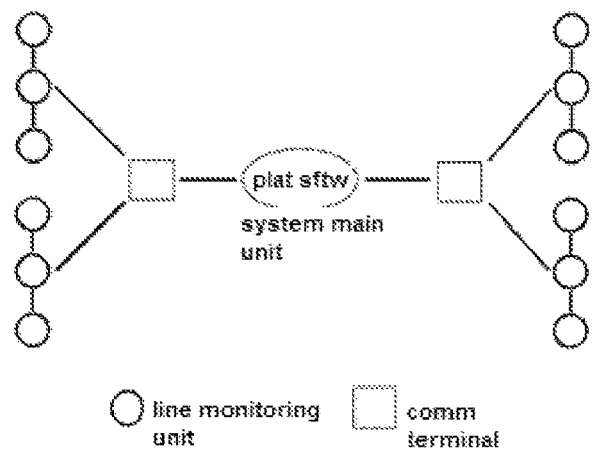

Structure IV: As shown in FIG. 15D, the corresponding system topology comprises: the feeder monitoring units, the communication terminal and the system central unit. One of the three-phase monitoring units such as B-phase unit communicates to the other two phase feeder monitoring units using time-division multiplexing wireless communication, forming a wireless communication network. At the same time, this feeder monitoring unit and the communication terminal communicate on another frequency, using time-division multiplexing wireless communication, forming another wireless communication network. Each communication terminal is connected to multiple feeder monitoring units, with FIG. 15D showing the communication terminal is connected to two the feeder monitoring units. The communication terminal and the system central unit communicate over GSM/GPRS, CDMA, and WIFI Ethernet. The system central unit and the communication terminals are using GPS timing. The communication terminal and the feeder monitoring units use time division multiplexing wireless communication network to synchronize time, so to finally achieve precisely synchronized system timing.

With a system based on any of the above structure, the system central unit's platform software can collect at each position in the three-phase distribution network, from the feeder monitoring units, for the voltage and the current waveform data. It then can calculate for each position the zero-sequence voltage and zero-sequence current. The system central unit's platform software, from the calculated zero-sequence voltage and zero-sequence current at each position, can extract at each position the zero-sequence voltage and zero-sequence current for the steady state signals, calculate the characteristic values, with the characteristic values include: amplitude, average, differential value, integral value and a combination thereof; also calculate the steady zero sequence active power, zero-sequence reactive power; calculate further the steady-state waveform similarity of the zero-sequence voltage and zero-sequence current signals; and based on differences in the steady-state zero-sequence voltage, zero-sequence current characteristic values and waveform similarity for fault line and non-fault lines, perform selection of the fault line and non-fault lines.

The system central unit's platform software, from the calculated zero-sequence voltage and zero-sequence current at each position, can extract at each position the zero-sequence voltage and zero-sequence current for the transient signals, calculate the characteristic values, with the characteristic values include: amplitude, average, differential value, integral value and a combination thereof; also calculate the transient zero sequence active power, zero-sequence reactive power; calculate further the transient state waveform similarity of the zero-sequence voltage and zero-sequence current signals; and based on the before fault and after fault locations the differences in the transient zero-sequence voltage, zero-sequence current characteristic values and waveform similarity, analyze for each position, especially with priority for the selected positions at the suspected fault line, to determine the ground fault point.

After the system central unit's platform software positioning the ground fault point, the result can set to have a manual secondary review to conclusively determine the final ground fault position. The result is displayed on the GIS map for the ground fault point. At the same time the system central unit's platform software system by time division multiplexing wireless communication network, issues a ground fault signal to the feeder monitoring unit to indicate the ground fault, so to conveniently allow manual line tracing to locate the ground fault position.

The above are only some of the preferred embodiments of the present invention, but the scope of the present invention is not limited to these. Any person skilled in the art and within the technical field of the present disclosure, if he can easily think of a change or a replacement, such change or replacement should fall within the scope of the invention. Accordingly, the protection scope of the present invention should be guided by the scope of the claims.

The invention claimed is:

1. A low current single-phase ground fault detection and location system comprising:
    a plurality of sets of three feeder monitoring devices placed at a plurality of locations throughout a three-phase power distribution network, wherein each set includes three feeder monitoring devices, and within each set, one feeder monitoring device is placed on each phase line of said three-phase power distribution network at a corresponding location of the plurality of locations; and
    a ground fault location unit located remotely from said feeder monitoring devices configured to:
    calculate corresponding zero-sequence voltage and zero-sequence current for each of the sets of feeder monitoring devices at the plurality of locations based on synchronously collected voltage and current signals by said feeder monitoring devices;
    calculate steady state signals and transient signals for each of the sets of feeder monitoring devices at the plurality of locations based on the calculated corresponding zero-sequence voltage and zero-sequence current;
    determine a phase line for which a ground fault has occurred based on said calculated steady state signals; and
    determine a location of the ground fault on the determined phase line based on said calculated transient signals and
    each said feeder monitoring device comprising:
    capacitive voltage sensors to detect said voltage signals, and electronic current sensors to detect said current signals;
    a feeder parameter monitoring module configured to process the detected voltage and current signals, and send a notification to synchronize signal collection to adjacent feeder parameter monitoring modules in the same set based on said voltage and current signals; and
    a time synchronization module connected to the feeder parameter monitoring module, configured to receive a notification sent by an adjacent monitoring device to synchronize collection of said voltage and current signals on each set of said feeder monitoring devices.

2. The system according to claim 1, wherein the ground fault location unit comprises:
    a ground fault line location module, configured to:
        calculate one or more characteristic values of the steady-state signals, wherein the characteristic value includes any of amplitude, average, differential value, or integral value;
        based on calculating steady zero sequence active power and zero-sequence reactive power, further calculate steady-state waveform similarity of the steady-state signal;
        based on differences in the steady-state signal characteristic values and the waveform similarity at each phase line, determine the selection of the ground fault phase line;
    and a fault point positioning module, configured to:
        calculate at the plurality locations at the ground fault phase line indicated by the ground fault line location module, one of more characteristic values of the transient signal at each of the plurality of locations, wherein the characteristic value includes any of amplitude, average, differential value, or integral value;
        based on calculating at the plurality locations of the ground fault phase line, the transient zero sequence active power and reactive power zero-sequence, further calculate the waveform similarity of the transient signal;
        based on differences in the transient waveform similarity and the characteristic values at each location, determine the ground fault location on the selected phase line.

3. The system according to claim 1, further comprises:
    a fault display and indication processing unit configured to display the ground fault location on a geographic information system (GIS) map, and to send a ground fault signal through a wireless communication network to a fault indication unit near the ground fault location for display, wherein the fault indication unit is one of a plurality of fault indication units placed near the plurality of locations.

4. The system according to claim 1, further comprises:
    a plurality of communication terminal devices configured to communicate with the plurality of feeder monitoring devices to relay the collected values of the current and voltage sensed to the ground fault locating unit wirelessly, wherein one communication terminal device pairs with one set of feeder monitoring devices, such that:
the communication terminal device is configured to use a time division multiplexing method to wirelessly communicate directly with all three feeder monitoring device within the set;
or
the communication terminal device is configured to wirelessly communicate directly with only one of the three feeder devices acting as a proxy for the set, wherein the collection of values from the other two feeder monitoring devices is accomplished by the proxy device;
or
one of the three feeder devices is configured to act as a proxy for the whole set would directly incorporate the communication terminal device into itself, to communicate with the other two using time-division multiplexing wireless communication.

* * * * *